(12) United States Patent
Lin et al.

(10) Patent No.: US 8,132,615 B2
(45) Date of Patent: Mar. 13, 2012

(54) HEAT SINK AND HEAT DISSIPATION DEVICE HAVING THE SAME

(75) Inventors: Kuo-Len Lin, Wugu Township, Taipei County (TW); Wen-Jung Liu, Wugu Township, Taipei County (TW); Chen-Hsiang Lin, Wugu Township, Taipei County (TW)

(73) Assignee: CPUMATE Inc., Taipei County (TW)

( * ) Notice: Subject to any disclaimer, the term of this patent is extended or adjusted under 35 U.S.C. 154(b) by 952 days.

(21) Appl. No.: 12/133,030

(22) Filed: Jun. 4, 2008

(65) Prior Publication Data

US 2009/0237882 A1 Sep. 24, 2009

Related U.S. Application Data

(63) Continuation-in-part of application No. 12/052,167, filed on Mar. 20, 2008, now abandoned.

(51) Int. Cl.
*F28F 7/00* (2006.01)
(52) U.S. Cl. .............. 165/80.3; 165/80.2; 165/104.33; 165/104.21; 165/185; 361/697
(58) Field of Classification Search .............. 165/80.2, 165/80.3, 80.4, 104.21, 104.26, 104.33, 185; 361/697
See application file for complete search history.

(56) References Cited

U.S. PATENT DOCUMENTS

| 7,130,192 | B2* | 10/2006 | Wang et al. | 165/80.3 |
| 7,580,263 | B2* | 8/2009 | Xu | 361/697 |
| 7,589,967 | B2* | 9/2009 | Zhou et al. | 361/697 |
| 7,952,872 | B1* | 5/2011 | Hata et al. | 361/697 |
| 2005/0073811 | A1* | 4/2005 | Wang et al. | 361/709 |
| 2006/0137861 | A1* | 6/2006 | Wang et al. | 165/104.33 |

* cited by examiner

*Primary Examiner* — Ljiljana Ciric
(74) *Attorney, Agent, or Firm* — Chun-Ming Shih; HDLS IPR Services

(57) ABSTRACT

A heat sink includes a heat dissipation fins assembly, a heat spreader, and a heat pipe. The heat dissipation fins assembly includes a plurality of heat dissipation fins. A guide plate extruding from a bottom of each of the heat dissipation fins. The guide plate being connected to an adjacent heat dissipation fins. The heat dissipation fins are connected in series by the guide plate thereby defining a number of air channels. Each heat dissipation fin includes a through hole defined therein and aligned with each other. The heat spreader is disposed under the heat dissipation fins assembly and a through groove is formed in the heat spreader. A heat pipe passes through the through hole and the through groove. The heat sink has improved heat dissipation efficiency.

14 Claims, 6 Drawing Sheets

HEAT SINK AND HEAT DISSIPATION DEVICE HAVING THE SAME

RELATED APPLICATIONS

This application is a continuation-in-part of U.S. patent application Ser. No 12/052,167, filed Mar. 20, 2008 now abandoned the entire subject of which is hereby incorporated herein by reference for all purposes.

BACKGROUND

The present invention relates to a heat dissipation device, and more particularly, to a heat dissipation device having bidirectional air channels.

With highly development of information technology, operating rate of electronic components in a computer (e.g. a CPU) has been greatly improved, and use of computers are becoming easier and easier.

However, high operating rate electronic components produce too much heat during working, if the heat generated is not removed immediately, a performance of the electronic components will be reduced and the electronic components will even be burn out.

Typically, a generally used heat dissipation device includes a heat dissipation member and a fan secured above or at a side of the heat dissipation member. The heat dissipation member is usually made using an aluminum extrusion process and includes a base, a number of spaced arranged heat dissipation fins extruding from the base. The heat dissipation fins define heat dissipation channels therebetween. A bottom surface of the base is attached to a heat-generating electronic member.

The heat generated by the electronic member is conducted to the base and finally dissipated to the ambient air by blowing air to the heat dissipation fins using the fan.

In such instance, the electronic member is covered by the base of the heat dissipation device; therefore, the air blown by the fan can't come in direct contact with the electronic member whether the fan is above or at a side of the heat dissipation member. The heat generated by the electronic member is transferred only through a heat conduction process, which is insufficient in many circumstances.

Therefore, another type of heat dissipation device is developed to overcome above problems, which includes a fan, a heat dissipation member, a heat spreader and a number of heat pipes. The fan is secured above the heat dissipation member. The heat dissipation member includes a number of through hole therein, and the heat spreader includes a number of through grooves defined therein. The heat spreader is attached to a heat generating electronic member. The heat pipes are received in the through holes and the through grooves.

Compared with above heat dissipation device, heat dissipation efficiency is greatly improved as the working fluid contained in the heat pipes can absorb a lot of heat when the working fluid is gasified. However, if a bottom portion of the heat dissipation member is closed, the heat is also transferred to the heat spreader through heat conduction; if the bottom portion of the heat dissipation member is open, the air blown by the fan dispersed immediately.

Therefore, there is a desire to develop a heat dissipation device which can overcome above disadvantages and achieves maximum heat dissipation efficiency.

BRIEF SUMMARY

An object of the present invention is to provide a heat dissipation device having bidirectional air channels. The air blow by a fan can pass through the bidirectional air channels and then vent into ambient air of the heat dissipation device.

In one exemplary embodiment, a heat dissipation device having bidirectional air channels includes a fan and a heat sink mounted under the fan. The heat sink includes a heat dissipation fins assembly, a heat spreader, and a heat pipe. The heat dissipation fins assembly includes a plurality of heat dissipation fins. A guide plate extrudes from a bottom of each of the heat dissipation fins. The guide plate is connected to an adjacent heat dissipation fin. The heat dissipation fins are connected in series by the guide plate thereby defining a number of air channels. Each heat dissipation fin includes a through hole defined therein and aligned with each other. The heat spreader is disposed under the heat dissipation fins assembly and a through groove is formed in the heat spreader. A heat pipe passing through the through hole and the through groove.

In another exemplary embodiment, a heat sink includes a heat dissipation fins assembly, a heat spreader, and a heat pipe. The heat dissipation fins assembly includes a plurality of heat dissipation fins. A guide plate extrudes from a bottom of each of the heat dissipation fins. The is connected to an adjacent heat dissipation fin. The heat dissipation fins are connected in series by the guide plate thereby defining a number of air channels. Each heat dissipation fin includes a through hole defined therein and aligned with each other. The heat spreader is disposed under the heat dissipation fins assembly and a through groove is formed in the heat spreader. A heat pipe passing through the through hole and the through groove.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

The present heat dissipation device will be described in detail with reference to the drawings. However, it is to be understood that the drawings are intended to illustrate the heat dissipation device rather limit the scope of the heat dissipation device.

Figure 1:
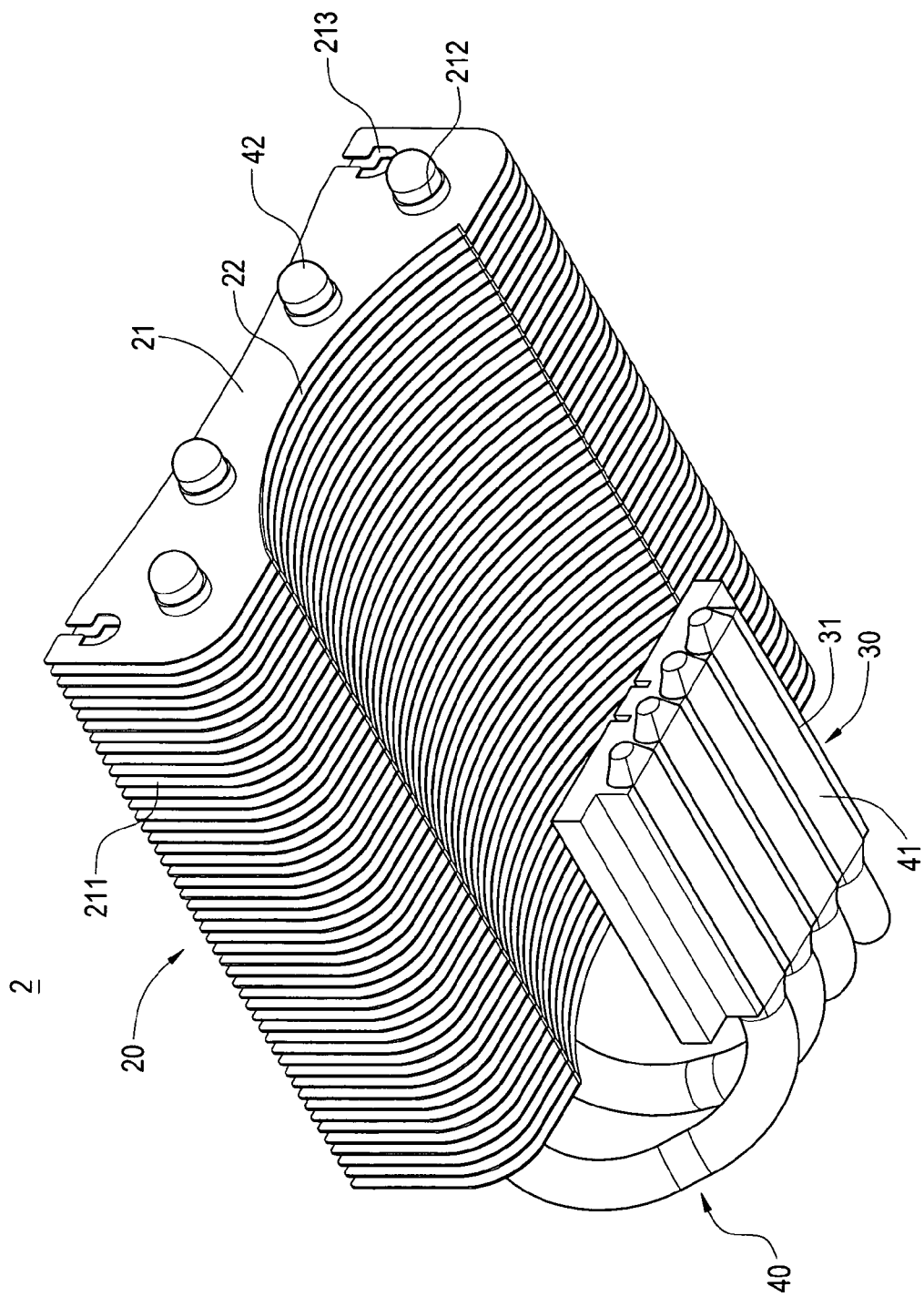
FIG. 1 is a perspective view showing an assembled heat sink in accordance with the present embodiment.
Figure 2:
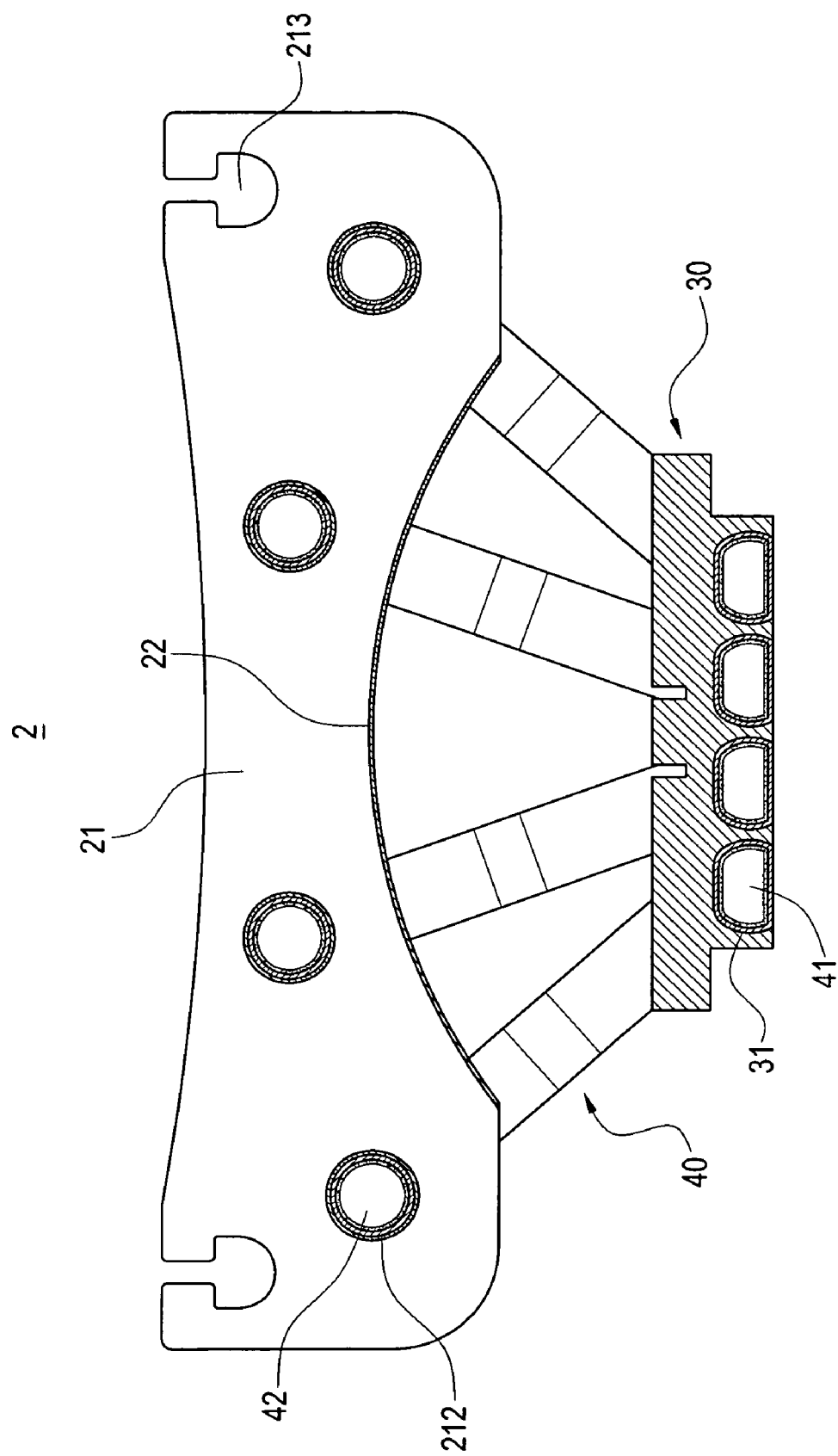
FIG. 2 is a front view of the heat sink in FIG. 1.

Referring to FIGS. 1 and 2, which respectively illustrate perspective view and from view of a heat sink 2 in accordance with the present embodiment, the heat sink 2 includes a heat dissipation fins assembly 20, a heat spreader 30 and a number of (e.g. four) heat pipes 40.

The heat dissipation fins assembly 20 includes a number of heat dissipation fins 21. Each of the heat dissipation fins 21 includes a concave arc shaped top surface and a concave arc shaped bottom surface. In other words, height of each of the heat dissipation fins 21 decreases from two ends to a central portion. A concave arc shaped guide plate 22 extends from a bottom end (i.e. the end that is adjacent to the heat spreader) of each of the heat dissipation fins 21. Specifically, in the present embodiment, all the guide plates 22 extend in a same direction, and a proximal end of each of guide plates 22 (i.e. the end that is away from the heat dissipation fin 21 from which the guide plate 22 extends) is in contact with an adjacent heat dissipation fin 21. As a result, each two adjacent heat dissipation fins 21 and a guide plate 22 cooperatively form an air channel. Each of the guide plate 22 closes a bottom end of a respective air channel. In addition, two securing grooves 213 are formed in two opposite ends of the top surface of each of the heat dissipation fins 21. In the present embodiment, securing grooves 213 in each end of the heat dissipation fins 21 are aligned. Four through holes 212 are defined in the heat dissipation fins 21. The fourth through holes 212 are aligned with each other. However, it is to be understood that the arrangement of the through holes is not limited to the illustrated arrangement. The heat spreader 30 is disposed under the heat dissipation fins assembly 20. In the present embodiment, four through grooves 31 are formed in a bottom portion (i.e. the portion that is away from the heat dissipation fins assembly 20) of the heat spreader 30.

The heat pipes 40 are in "U" shape, and each includes a heat-absorbing section 41 and a heat-dissipating section 42 extending from the heat-absorbing section 41. The heat dissipation section 42 passes through a corresponding through hole 212, and the heat-absorbing section 41 is received in a corresponding through groove 31. In addition, the heat-absorbing section 41 includes a flat bottom surface, which lies in a same surface of a bottom surface of the heat spreader 30.

Figure 3:
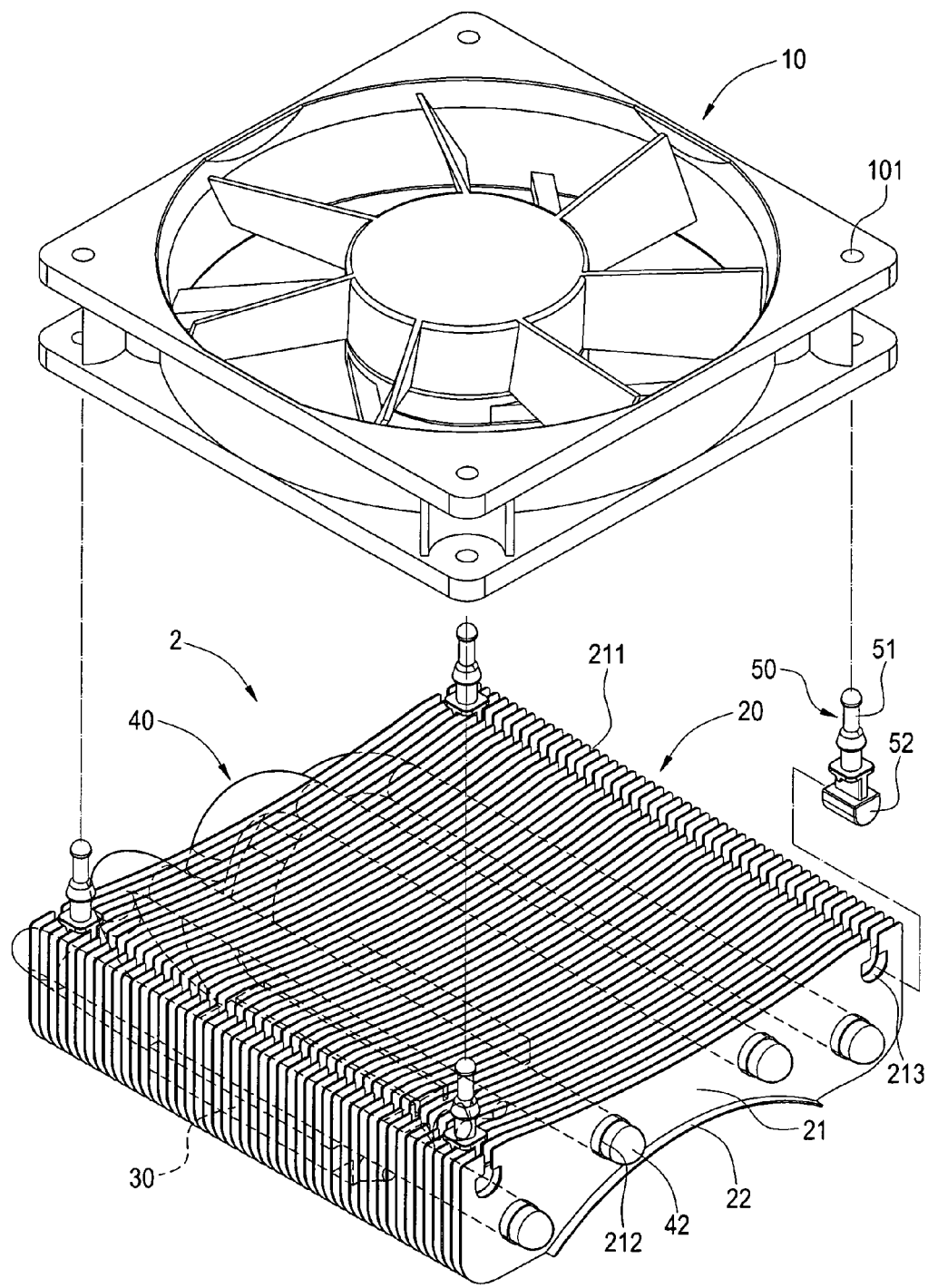
FIG. 3 is a front view of a disassembled heat dissipation device in accordance with the present embodiment.
Figure 4:
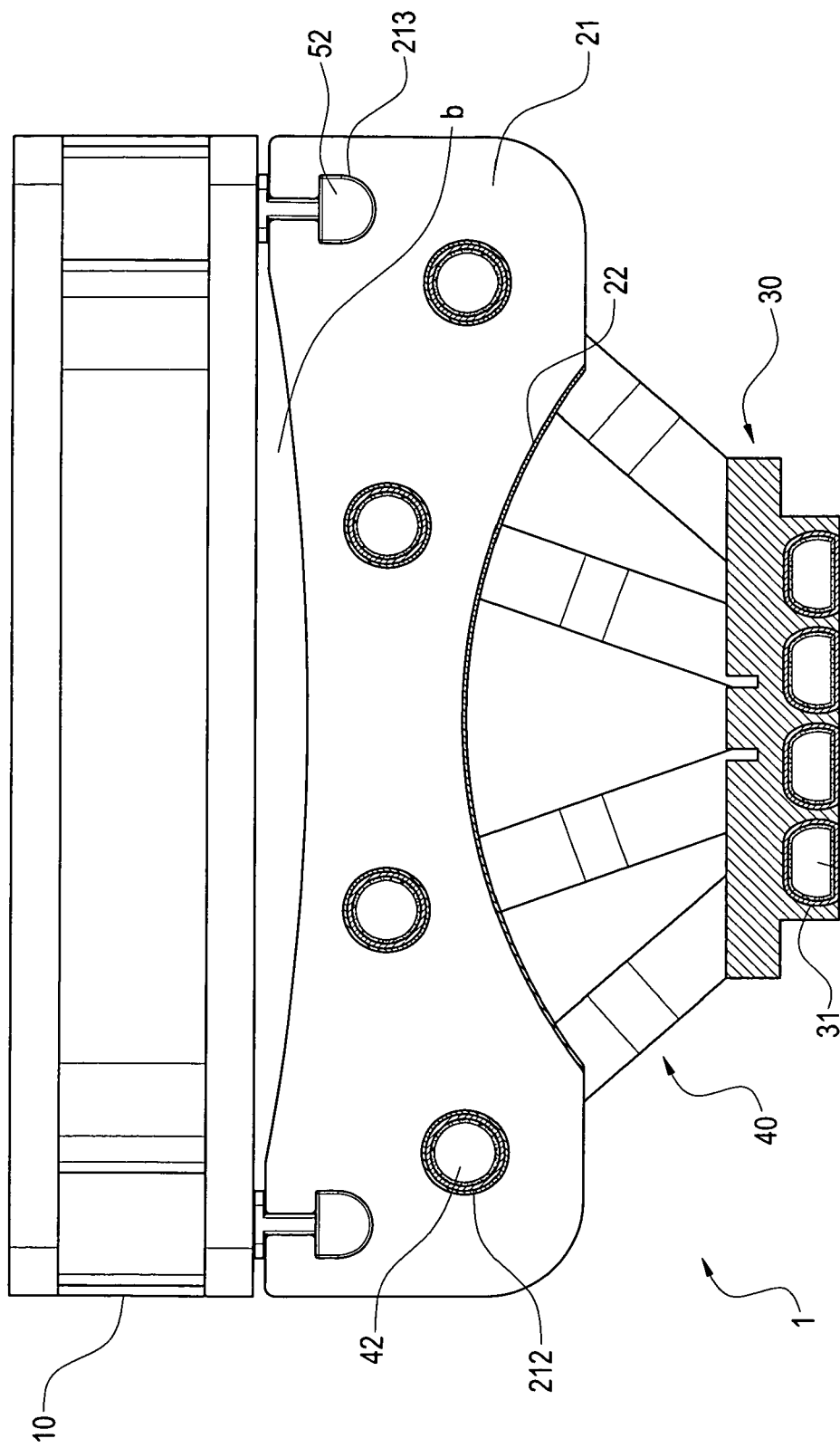
FIG. 4 is a front view of the heat dissipation device of FIG. 3.
Figure 5:
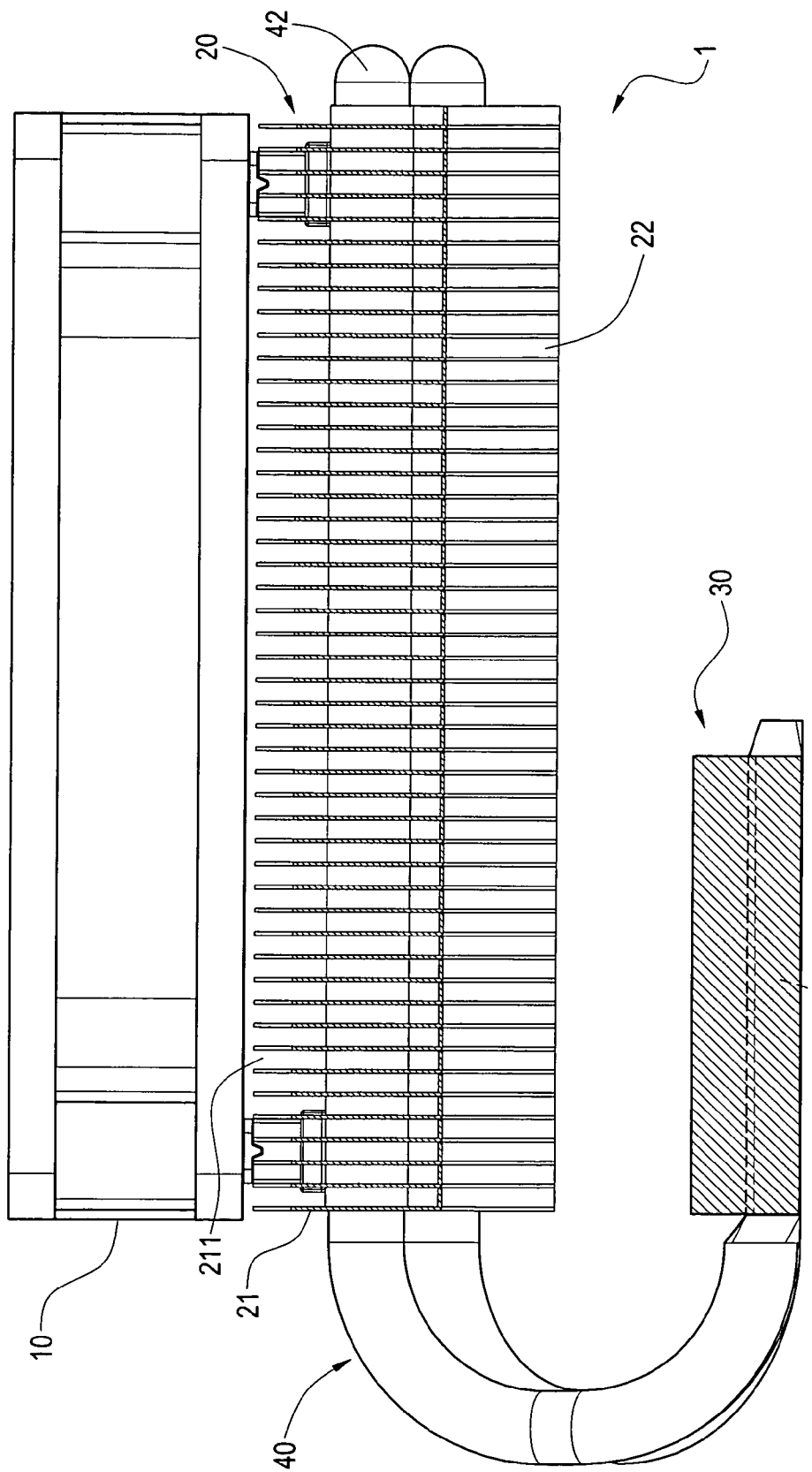
FIG. 5 is a side view of the heat dissipation device of FIG. 3.

Referring to FIGS. 3 and 5, the heat sink 2 is assembled together with a fan 10 thereby obtaining a heat dissipation device. In the present embodiment, the heat dissipation device includes the heat sink 2 and one fan 10. However, it is to be understood that more fans 10 can also be employed. A securing hole 101 is defined in each of the four corners of the fan 10. The securing hole 101 and the securing groove 213 are configured for securing a shock-absorbing member 50. The shock-absorbing member 50 includes a connecting column 61 and a fixing block 52 at two opposite ends. The securing hole 101 is capable of receiving the connecting column 41, and the securing groove 213 is capable of securing the fixing block. The shock-absorbing member 50 can be made of rubber or silicone rubber.

Figure 6:
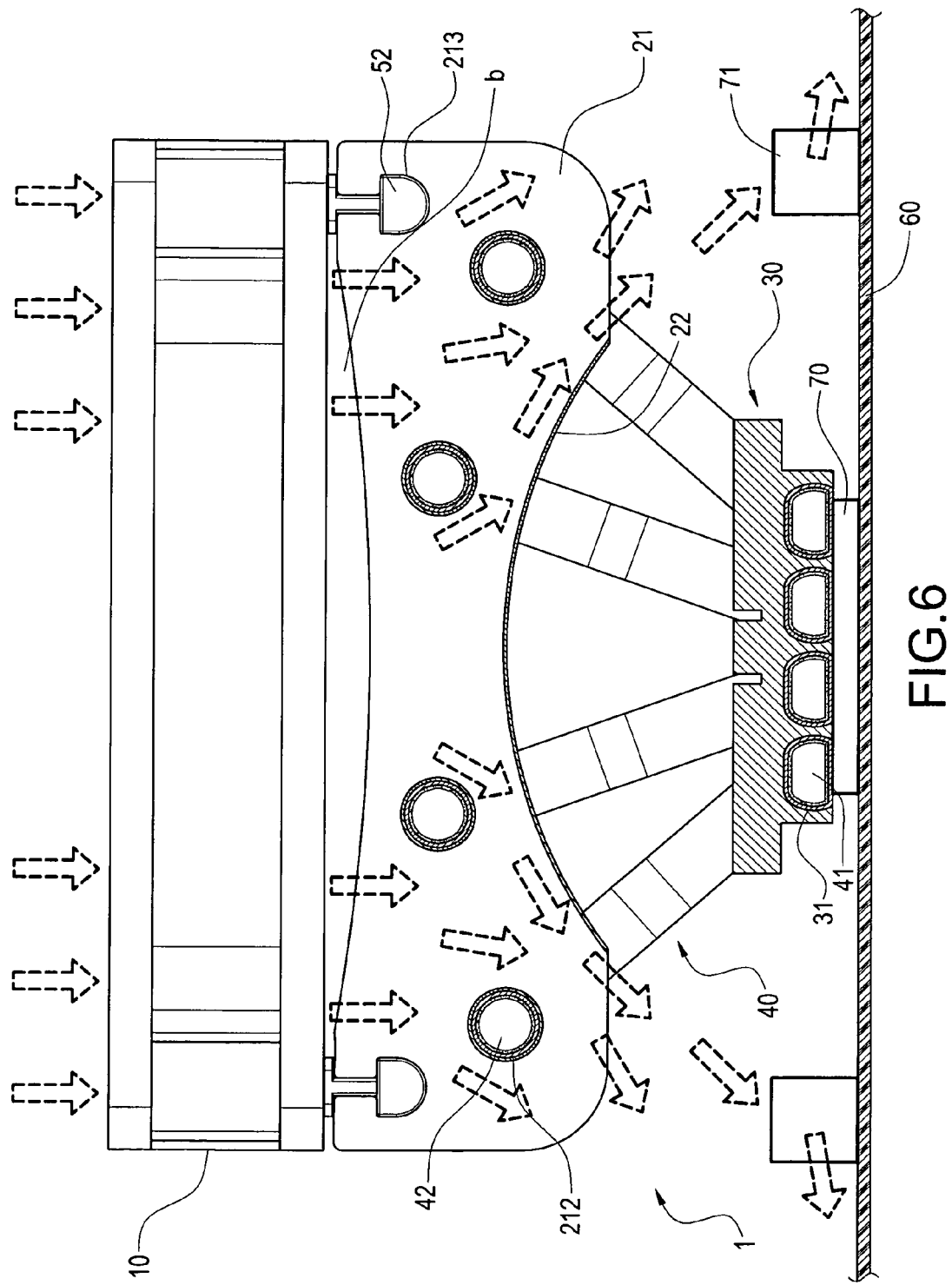
FIG. 6 is schematic view showing a practical application of the heat dissipation device of FIG. 3.

FIG. 6 illustrates a practical application of the heat dissipation device. The heat dissipation device is attached to an electronic member 70 mounted on a printed circuit board 60. When the fan is running, air above the fan 10 is sucked into the fan and then blown to a bottom portion of the heat dissipation device.

When the airflow enters the heat dissipation fins assembly 20, a separating space b defined by the concave arc shaped top surface of the heat dissipation fins 21 prevents the airflow from directly hitting the heat dissipation fins assembly 20. As a result, turbulent flow doesn't produce. In sequent, the airflow is conducted to peripheral portion of the heat spreader 30 by the guide plate 22. The heat spreader 30 and the heat-absorbing section 41 are attached to the electronic member 70 for dissipating heat generated by the electronic member 70.

The airflow blown by the fan 10 flows through the air channels 211 (as shown in FIG. 5) and finally conducted to peripheral portion of the heat spreader 30, as a result, the airflow can facilitate dissipation of heat generated around peripheral portion of the head spreader 30. Thus, heat dissipation efficiency is improved. The airflow conducted into the heat dissipation fins assembly 20 facilitates dissipation of heat generated by the electronic members 71 mounted around the heat dissipation device.

The present heat dissipation device and heat sink have following advantages:

Firstly, the guide plate 22 can conduct the airflow blown by the fan to pass through the air channels 211 in two directions. The heat dissipation device can simultaneously dissipate heat generated by the electronic member 70 and electronic members 71 mounted around the electronic member 70. The airflow blown by the fan 10 is sufficiently used and heat dissipation efficiency is improved.

Secondly, the separating space b defined by the concave arc shaped top surface of the heat dissipation fins 21 prevents the airflow from directly hitting the heat dissipation fins assembly 20. As a result, turbulent flow doesn't produce and heat dissipation efficiency is improved.

Thirdly, the securing grooves 213 can facilitate assembling of the heat dissipation fins assembly 20 and the fan 10. An assembling time and cost can be reduced.

Fourthly, the shock-absorbing member 50 can absorbing shock of fan 10 during working, a stability of the heat dissipation device is improved. In addition, the shock-absorbing member 50 also reduces noised produced by the heat dissipation device. The heat dissipation device is quieter.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A heat dissipation device having bidirectional air channels, comprising:
   a fan, and
   a heat sink mounted under the fan, the heat sink comprising:
   a heat dissipation fins assembly comprising a plurality of heat dissipation fins, a guide plate extending from a bottom end of each of the heat dissipation fins, the guide plate being connected to an adjacent heat dissipation fins, the heat dissipation fins being connected in series by the guide plates thereby defining a plurality of air channels, each heat dissipation fin comprising a through hole defined therein aligned with each other;
   a heat spreader disposed under the heat dissipation fins assembly, a through groove being formed in the heat spreader; and
   a heat pipe passing through the through hole and the through groove;
   an airflow blown from the fan flowing through the air channels and being vent into ambient of the heat spreader along the guide plate in two directions.

2. The heat dissipation device as claimed in claim 1, wherein the guide plate is in concave arc shape in a transversal direction thereof.

3. The heat dissipation device as claimed in claim 1, wherein each of the heat dissipation fins comprises a concave arc shaped top surface thereby defining a separating space between the fan and the heat dissipation fins.

4. The heat dissipation device as claimed in claim 1, wherein bottom portions of the heat dissipation fins are closed.

5. The heat dissipation device as claimed in claim 1, further comprising a plurality of shock-absorbing members with two ends thereof respectively connected to the fan and the heat sink.

6. The heat dissipation device as claimed in claim 5, wherein a connecting column and a fixing block are respectively formed on two ends of each of the shock-absorbing members, a plurality of securing holes are defined in a side of the fan, a plurality of securing grooves corresponding to the securing holes, each of the securing holes is configured for receiving a respective connecting column, and each of the securing grooves is configured for securing a corresponding fixing block.

7. The heat dissipation device as claimed in claim 1, wherein the heat pipe comprises a heat-absorbing section and a heat dissipating section extending from the heat-absorbing section, the heat-absorbing section is received in the through groove, and the heat-dissipation section is received in the through hole.

8. The heat dissipation device as claimed in claim 7, wherein a bottom portion of the heat-absorbing section includes a flat surface that lies in a same surface with a bottom surface of the heat spreader.

9. The heat dissipation device as claimed in claim 1, wherein the guide plate is in concave arc shape in a transversal direction thereof.

10. The heat dissipation device as claimed in claim 1, wherein each of the heat dissipation fins comprises a concave arc shaped top surface.

11. The heat dissipation device as claimed in claim 1, wherein bottom portions of the heat dissipation fins are closed.

12. The heat dissipation device as claimed in claim 1, wherein the heat pipe comprises a heat-absorbing section and a heat dissipating section extending from the heat-absorbing section, the heat-absorbing section is received in the through groove, and the heat-dissipation section is received in the through hole.

13. A heat sink having bidirectional air channels, comprising:
   a heat dissipation fins assembly comprising a plurality of heat dissipation fins, a guide plate extending from a bottom end of each of the heat dissipation fins, the guide plate being connected to an adjacent heat dissipation fins, the heat dissipation fins being connected in series by the guide plates thereby defining a plurality of air channels, each heat dissipation fin comprising a through hole defined therein aligned with each other;
   a heat spreader disposed under the heat dissipation fins assembly, a through groove being formed in the heat spreader; and
   a heat pipe passing through the through hole and the through groove;
   an airflow blown from the fan flowing through the air channels and being vent into ambient of the heat spreader along the guide plate in two directions.

14. The heat dissipation device as claimed in claim 13, wherein a bottom portion of the heat-absorbing section includes a flat surface that lies in a same surface with a bottom surface of the heat spreader.

* * * * *